(12) United States Patent
Feher

(10) Patent No.: US 6,855,880 B2
(45) Date of Patent: Feb. 15, 2005

(54) MODULAR THERMOELECTRIC COUPLE AND STACK

(76) Inventor: Steve Feher, 1 Keahole Pl., Suite 1505, Honolulu, HI (US) 96825

( * ) Notice: Subject to any disclaimer, the term of this patent is extended or adjusted under 35 U.S.C. 154(b) by 0 days.

(21) Appl. No.: 10/126,765

(22) Filed: Apr. 22, 2002

(65) Prior Publication Data

US 2003/0066554 A1 Apr. 10, 2003

Related U.S. Application Data

(63) Continuation-in-part of application No. 09/972,288, filed on Oct. 5, 2001, now abandoned.

(51) Int. Cl.[7] ............................................. H01L 35/28
(52) U.S. Cl. ........................ 136/203; 136/211; 136/212
(58) Field of Search ................................ 136/203, 204, 136/211, 212; 62/3.2, 3.3, 3.7

(56) References Cited

U.S. PATENT DOCUMENTS

| | | | | | |
|---|---|---|---|---|---|
| 2,951,105 A | * | 8/1960 | Busanovich | ........... | 252/62.3 T |
| 3,019,609 A | * | 2/1962 | Pietsch | ........................ | 62/3.3 |
| 3,077,079 A | * | 2/1963 | Pietsch | ........................ | 62/3.3 |
| 3,083,248 A | * | 3/1963 | Schumacher | ............... | 136/204 |
| 4,811,927 A | * | 3/1989 | Slonimsky et al. | ......... | 249/210 |
| 5,966,939 A | * | 10/1999 | Tauchi | ........................ | 62/3.2 |

* cited by examiner

Primary Examiner—Patrick Ryan
Assistant Examiner—Thomas H. Parsons

(57) ABSTRACT

A thermoelectric semiconductor module (10) includes a plurality of semiconductor pellets (14, 18) having Peltier characteristics are mechanically interconnected and arranged in an electrical series circuit with heat transferring means (12, 16, 20) with all interconnections being directly made. The means (12, 16, 20) can be of platelike construction with an L-shaped cross-section or, alternatively, with a U-shaped cross-section. A large number of modules (10) can be arranged in a two-dimensional or three-dimensional stack (30) with adjacent lines or planes of modules electrically interrelated by end segment connectors (32). In a further version, one side of a modular plane has heat exchanger fins (44–50) while the other side is electrically connected by ceramic segments (58) with deposited conductors (56). In yet another version, the modules are mounted onto rotating discs (94, 96) so as to act as a fluid impeller moving therepast enhancing thermal efficiency.

15 Claims, 7 Drawing Sheets

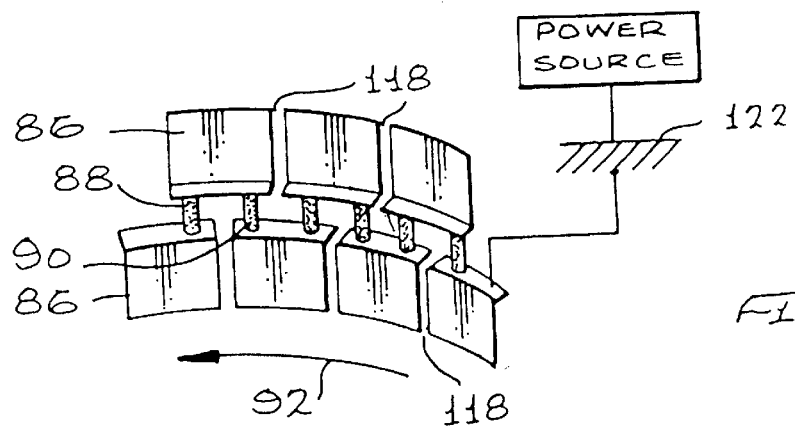
FIG.10
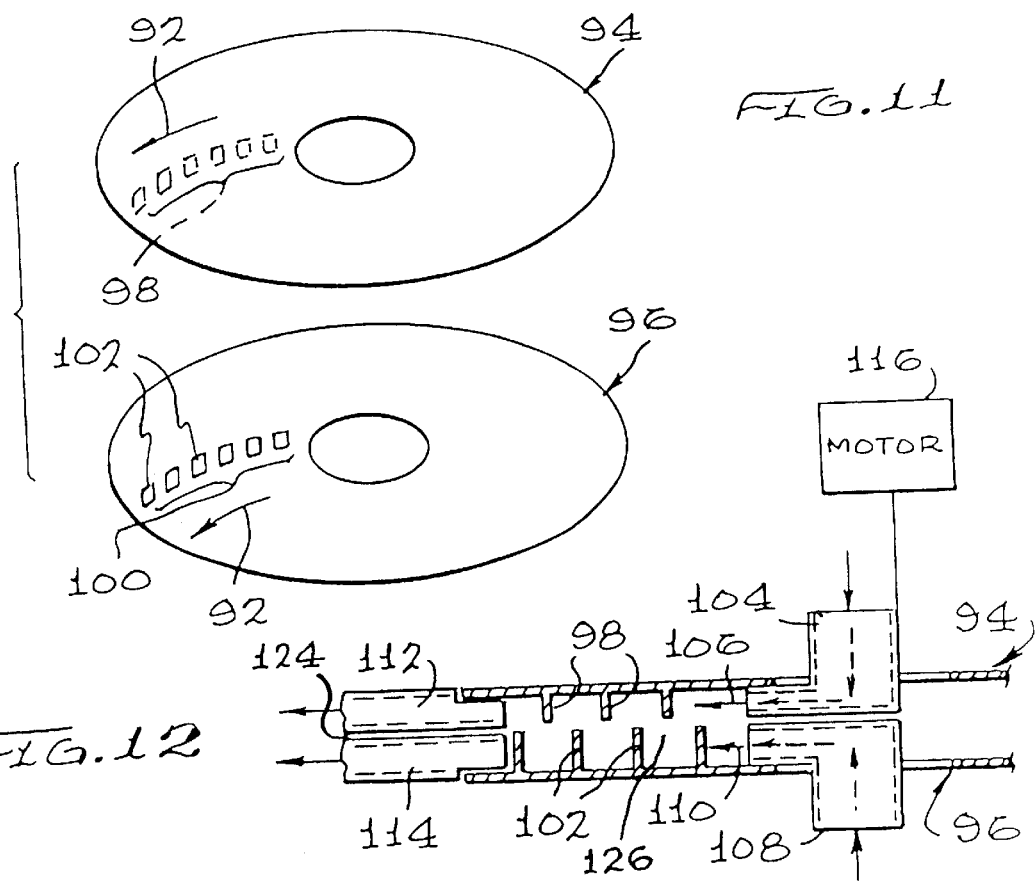
FIG.11
FIG.12
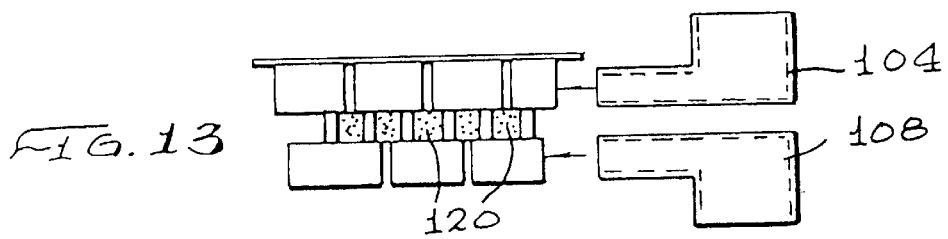
FIG.13

MODULAR THERMOELECTRIC COUPLE AND STACK

This is a continuation-in-part of Ser. No. 09/972,288 filed Oct. 5, 2001, abandoned.

BACKGROUND

1. Background of the Invention

The present invention relates generally to a thermoelectric heat pump, and, more particularly, to such a heat pump constructed of thermoelectric modules arranged in a stack.

2. Description of Related Art

It is known that when a quantity of p-type thermoelectric material is serially interconnected with a quantity of n-type thermoelectric material, that on passing an electric current through the so-formed module that heat will either be absorbed or emitted depending upon the current direction, thus acting as a heat pump as a result of what is known as the Peltier effect. It is also known to construct a relatively large refrigeration panel from a large number of semiconductor elements unitarily arranged. U.S. Re. No. 35,441. THERMOELECTRIC SEMICONDUCTOR HAVING A POROUS STRUCTURE DEAERATED IN A VACUUM AND THERMOELECTRIC PANEL USING P-TYPE AND N-TYPE THERMOELECTRIC SEMICONDUCTORS. Still further, U.S. Pat. No. 5,841,064, PELTIER MODULE, discloses a module composed of a plurality of semiconductor Peltier elements 1 mounted between substrates 2 and electrically interconnected by electrodes 10, the entire assembly enclosed by a hollow frame 3.

U.S. Pat. No. 3,943,553 concerns a thermoelectric assembly including thermoelectric couples having junction bridges 17 with ears 18 secured (soldered) to semiconductor bodies and other parts contactingly affixed to radiators 43, 44, the latter effecting the primary exchange of heat with ambient during operation. The junction bridges and radiators are separate elements of different construction that must be interconnected to one another both to achieve structural integrity and heat transfer from one to the other.

All known Peltier modular constructions have one or more of the following undesirable properties requiring compensation: an excessively high heat on a thermoelectric element "hot" side that can increase the temperature of the "cold" side impermissibly thereby reducing overall cooling efficiency; module packaging consisting of many different parts that results in correspondingly high cumulative heat resistance or impedance losses and reduction of operating efficiency (COP); overall relatively high weight; many interconnected metal (e.g., copper) and ceramic parts whose coefficients of expansion conflict thereby limiting size and numbers of modules that can be efficiently and reliably used in a unit.

SUMMARY OF THE INVENTION

It is a primary object and aim of this invention to provide a thermoelectric semiconductor module of improved character having an optimally minimal number of component parts that can produce undesirable thermal impedance losses during system operation.

Another object is the provision of a thermoelectric module having single structure means for providing electric power connection, heat transfer with ambient and structural rigidity.

Yet another object is the provision of an assembly of thermoelectric modules in accordance with the previous objects of increased power density.

A further object is the provision of improved thermoelectric modules and assembly thereof of reduced expansion and contraction problems between the component parts of the "hot" and "cold" sections.

In accordance with the practice of the present invention there are provided a plurality of semiconductor Peltier bodies or pellets mechanically and serially electrically connected to heat exchanger fins, the latter serving both to bring electrical energization to the pellets as well as to form heat transfer means to a desired location (e.g., ambient air). The pellets in an electrically connected stack are alternately of p-type and n-type semiconductor material, all of which pellets are serially interconnected. Alternatively, the metallic fins may be generally pin-shaped, L-shaped in cross-section with an upstanding heat transference to the ambient wall, or a U-shaped cross-section fin with two upstanding heat-transferring walls. An adjacent pair of serially connected semiconductor pellets will be referred to herein as a pellet couple.

A given plurality of pellet couples can be arranged in a single line or plane, or, alternatively, may be arranged un a number of spaced apart lines or planes with end segment connectors (jumpers) providing electrical interconnection for extending the serial circuit from one modular plane to an adjacent plane.

In yet another version, having general use application as hybrid solid or liquid-to-air, or air-to-solid or liquid, one side of each modular plane has the pellet couples interconnected by heat exchanger fins as described and the outer side of the modular plane is electrically connected by segmented dielectric ceramic or other thermally conductive contacts having conductive plating or traces on one side and leaving the outer side for physical bonding to a desired solid surface.

According to a still further version, a pair of dielectric plates with appropriate slots enabling fitting receipt onto the conductor/fins at each side of the pellet couples provides an air barrier between the "cold" and "hot" sides. Sealing means close off the edge space between dielectric plates. Alternatively, a single dielectric plate may be fitted onto the fins on one side of the pellet couples assembly and sealing means applied to close off both the dielectric plate edge space and spaces between adjacent module contact segments on side opposite that enclosed by the dielectric plate.

In yet another embodiment the pellet modules are mounted in curved lines extending from the center portion of disclike bases outwardly toward the base edges. In use, the bases with pellet modules are rotated as a unit ambient fluid (e.g., air) moves along the generally impeller-shaped set of modules to transfer heat as required.

BRIEF DESCRIPTION OF THE DRAWING

These and other objects of the present invention will become more readily apparent upon reading the following detailed description and upon reference to the attached drawings in which:

FIG. 10 is a perspective of a fourth embodiment of the invention;

FIG. 11 is an impeller mounting arrangement for the FIG. 10 embodiment;

FIG. 12 is an elevational view of FIG. 11;

FIG. 13 is an elevational view similar to FIG. 12 showing a thermoelectric module fully mounted therein;

DESCRIPTION OF PREFERRED EMBODIMENTS

Figure 1:
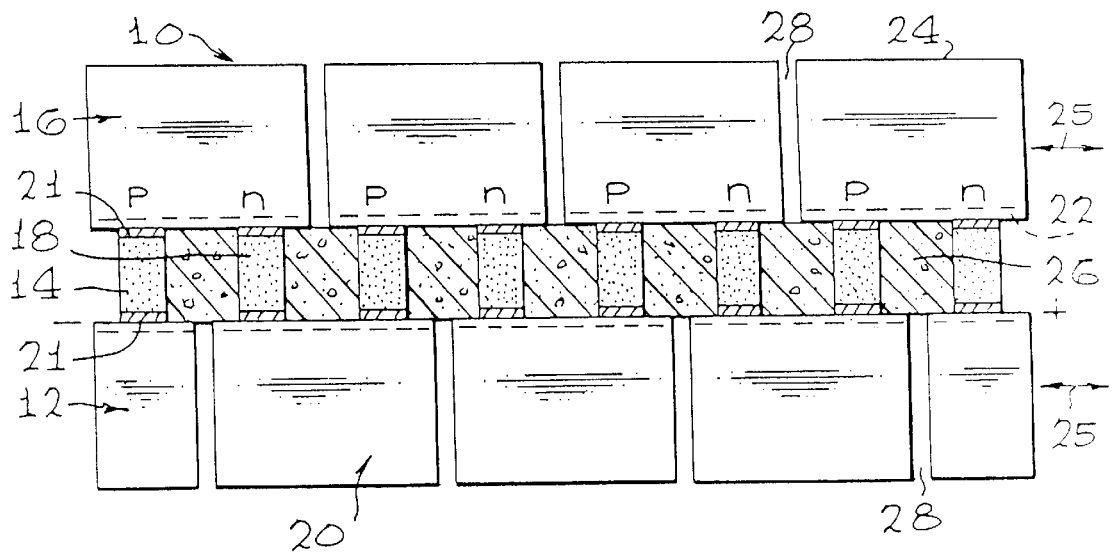
FIG. 1 is a side elevational view of a thermoelectric semiconductor multicouple assembly of the present invention.
Figure 2:
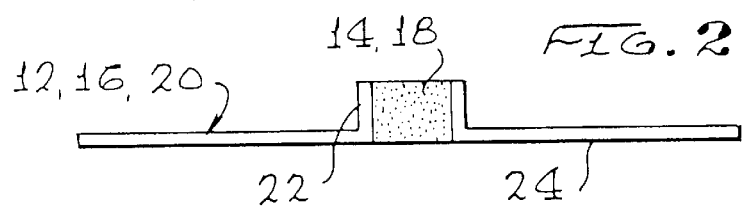
FIG. 2 is a left end elevational view of the multicouple assembly of FIG. 1.

Turning now to the drawing and a first embodiment of the invention, reference is made primarily to FIGS. 1 and 2. As shown there, a thermoelectric semiconductor couple of the invention is enumerated generally as 10 and includes a first electrode and heat transferring means 12, a quantity of a p-type the thermoelectric semiconductor 14, a second electrode and heat transferring means 16, a quantity of an n-type thermoelectric semiconductor 18 and a third electrode and heat transferring means 20. Each of the electrodes and heat transferring means, as the name implies, is constructed of a good electrical conductor as well as a suitable material for this purpose is a metal such as copper or aluminum. As indicated by the symbols "+" and "−", the means 12, 16 and 20 when connected with the semiconductor quantities 14 and 18 form an electrical series circuit via which the semiconductor quantities are energized to function thermoelectrically as a heat pump. The order of the p-type and n-type semiconductors may be changed, if desired, in which case the polarity of the energizing electrical power source must also be changed.

Electrical interconnection between the pellets 14,18 and the respective heat transferring means 12, 16 and 20 preferably includes a film or body of solder 21 which is directly mechanically and electrically adhered to both the pellet and to the heat transferring means.

As can be seen best on comparing FIGS. 1 and 2, each electrode and heat transferring means 12, 16 and 20 includes a generally platelike member of L-shaped cross-section (e.g., FIG. 2) having a relatively short crossbar 22 and an upstanding part 24 of substantially greater surface area than that of the crossbar. The crossbar functions generally to serve as an electrical interconnection point for a semiconductor body 14 or 18 by direct soldering, for example, whereas the upstanding part 24 operates to transfer heat to (or from) an ambient fluid or member depending upon whether the couple 10 is being used for heating or cooling.

Returning to FIG. 1, the means 12, 16 and 20 shown there serve to form a series circuit of four couples of the invention which would typically be arranged in a single plane and where air-to-air cooling operation is desired, the ambient air would move across the upstanding parts 24 for heat transfer in this regard indicated by the arrow 25. The space between the facing crossbars 22 and between the semiconductor pellets is filled with a closed-cell foam material 26 which acts to provide assembly rigidity and support, as well as thermoelectric pellet insulation and a cold/hot side air barrier. Not only do the gaps 28 between adjacent heat transferring means prevent an electrical short-circuit between pellet couples, but they also aid in preventing laminar air flow at low Reynolds numbers.

An excellent material from which to make the foam body 6 is isocyanurate foam, which is a two-component substance that expands to approximately 3 to 4 times its original volume after component mixing. This material has a very low thermal conductivity, low weight, good dielectric properties, and is relatively inexpensive. It is also self-extinguishing and has a service temperature rating of up to about 260 degrees F. A good alternative is also foamed silicone rubber.

Figure 3:
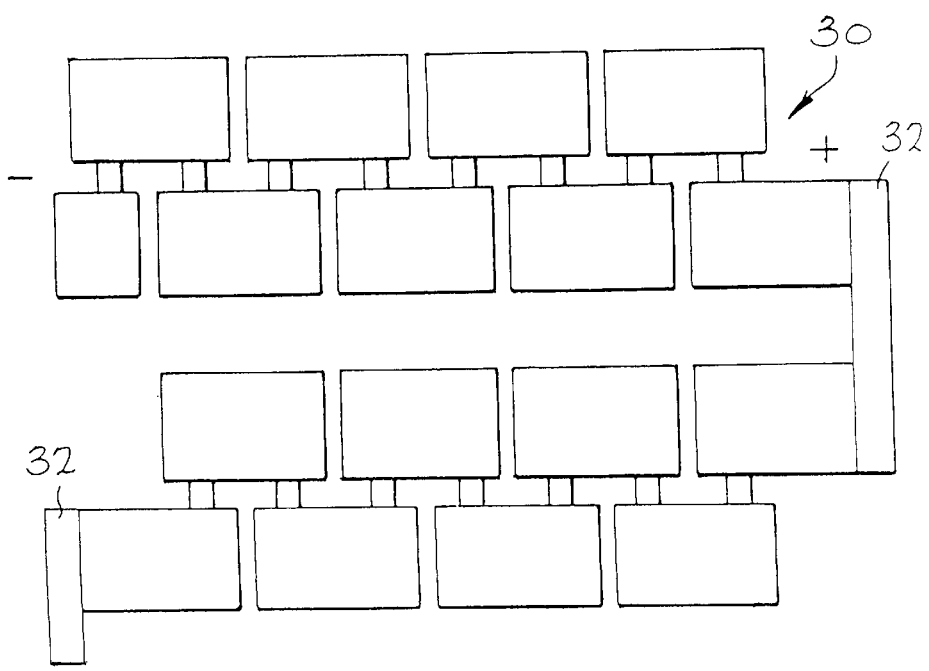
FIG. 3 is a plan view of a stack or array of multicouple assemblies physically and electrically interconnected.
Figure 4:
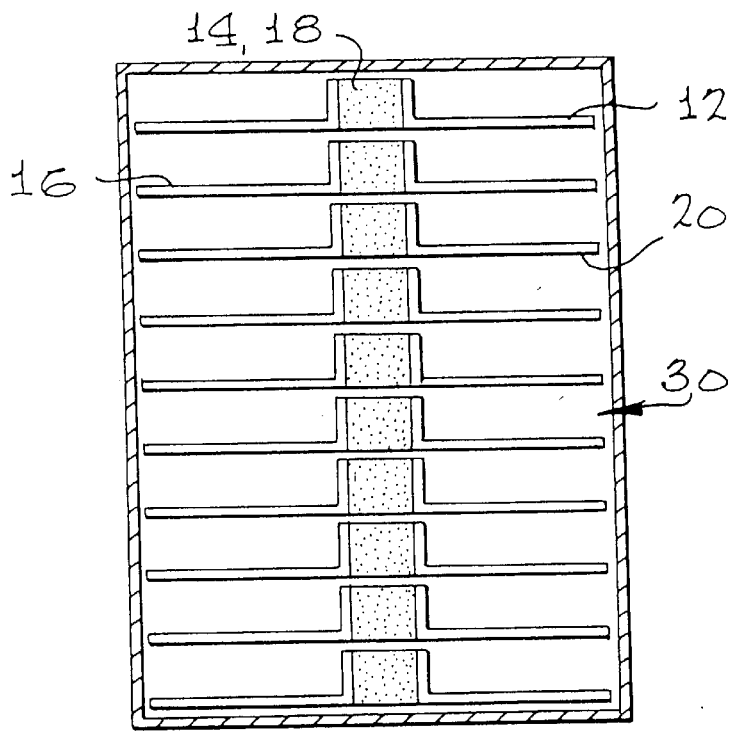
FIG. 4 is an elevational view of a stack as in FIG. 3.

FIG. 1 depicts a set of four pellet couples arranged in a single plane or line, however, in practical applications it may be desirable to arrange a much larger number of couples (e.g., 400) into a stack 30 where many planes of pellet couples are unitarily secured in spaced apart relation with ambient fluid passing between the various planes forming the stack for temperature modification. FIG. 4 is view of a stack 30 looking along the ambient air passages, and FIG. 3 is taken at 90-degrees thereto showing adjacent couple planes which are electrically related and mechanically rigidized by end segment connectors 32.

Figure 6:
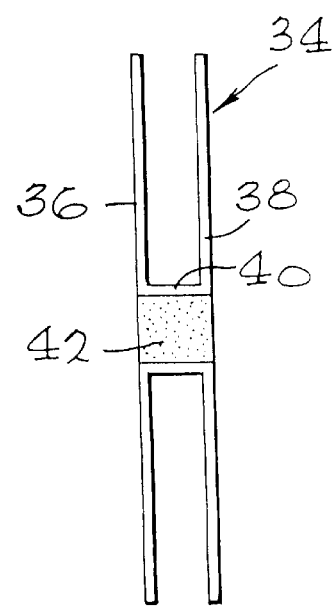
FIG. 6 is an elevational view of the thermoelectric couple of FIG. 5.
Figure 5:
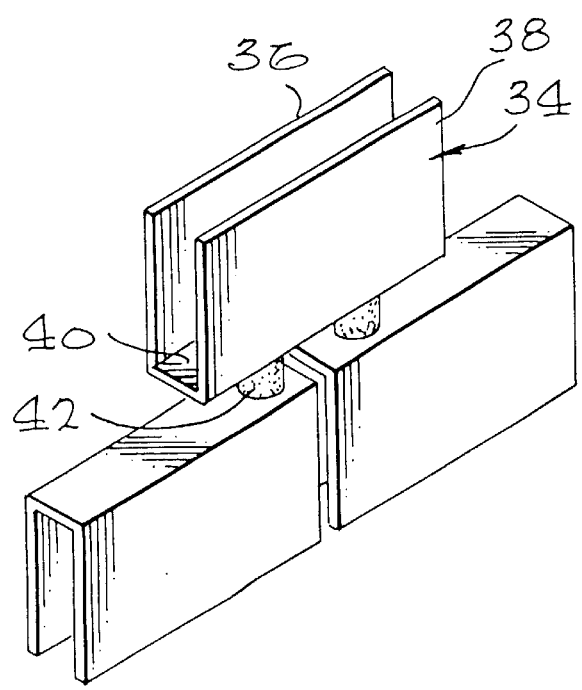
FIG. 5 is a perspective view of a second embodiment of thermoelectric couple.

Turning now to FIGS. 5 and 6, a significant increase in heat transfer ability is provided by constructing an electrode and heat transferring means 34 in general U-shape with first and second upstanding sheetlike fins 36 and 38 interconnected by a crossbar portion 40 that is electrically connected to a semiconductor pellet 42 similarly to the way the couples are interconnected in the first described embodiment.

Figure 7:
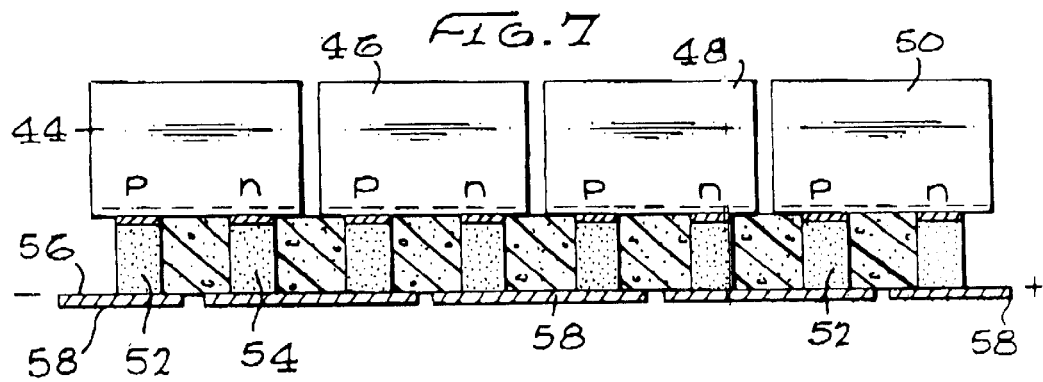
FIG. 7 is a third embodiment of thermoelectric couple construction for direct bonding to a solid surface.

For the ensuing description of a third embodiment of the invention, reference is made to FIG. 7. This embodiment is especially advantageous in being able to be assembled directly onto a solid surface which may be either part of an object to be "cooled", for example, or a waste heat sink. As shown, four electrodes and heat transferring means 44, 46, 48 and 50 have four pairs of p-type and n-type thermoelectric semiconductor bodies or pellets 52 and 54, respectively secured thereto as in the first described embodiment. However, instead of a further set of electrodes and heat transferring means, pairs of p- and n-type semiconductors are serially electrically connected by a conductor 56 deposited on one surface of a dielectric segment 58 (e.g., ceramic), the opposite surface of which can be adhered in any desired manner (e.g., soldered) to any desired solid surface without interfering with the electric energization of the pellets.

Figure 8:
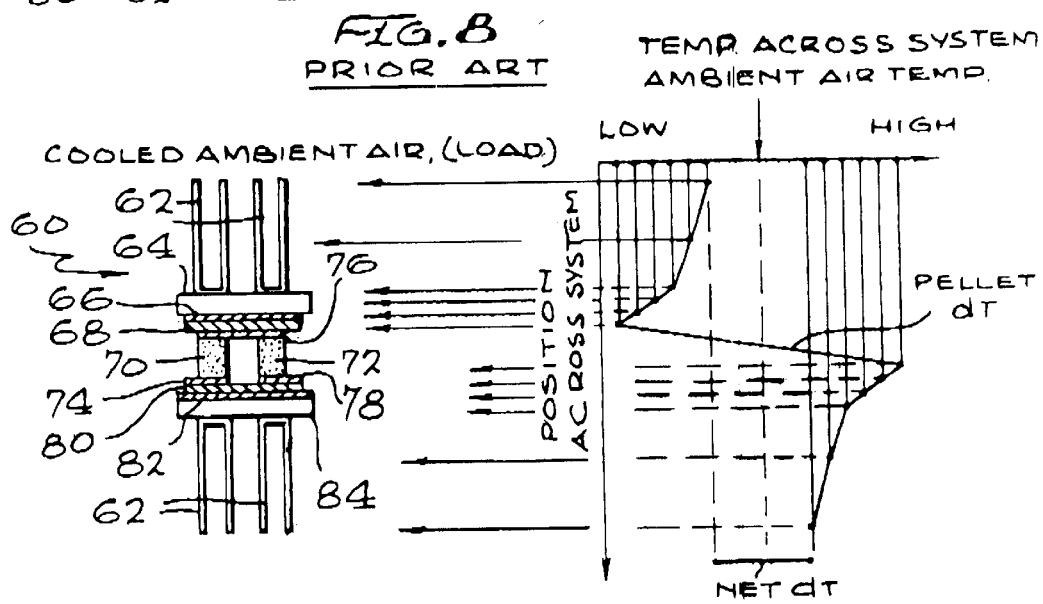
FIG. 8 is a depiction of a prior art multiple-element module and performance graph thereof.

FIG. 8 shows a prior art semiconductor module 60 composed of a number of different parts, each part of which is a potential source of thermal impedance loss during energization of the module. More particularly, heat transferring fins 62 for, say, the cooling side are mounted onto a baseplate 64 which, in turn, rests on a grease layer 66 and an underlying ceramic insulator 68. A pair of complementaiy thermoelectric semiconductor bodies 70 and 72 are electrically interconnected by conductors 74, 76 and 78, conductor 76 contacting the underside of the insulator 68. The lower half of the module similarly includes a further ceramic insulator 80 in contact with conductors 74 and 78, a grease layer 82, baseplate 84, and waste heat fins 62. The operational temperatures of the various parts of an actual test run produced the graph shown to the right in FIG. 8.

Figure 9:
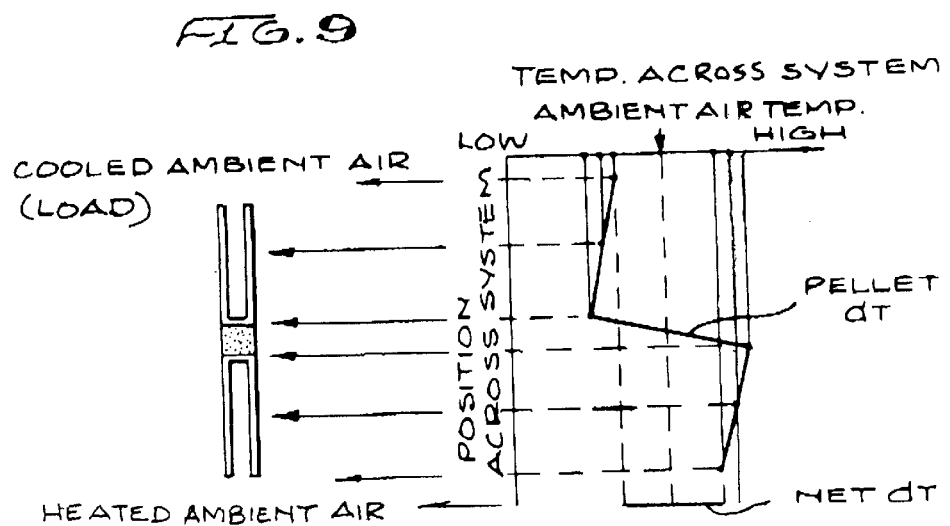
FIG. 9 is a graph of performance for the invention as in FIG. 1.

FIG. 9 depicts a module of the FIG. 6 embodiment of this invention which has the operational temperatures of its various components and ambient air measured to provide the graph shown adjacent. On comparing the prior art graph of FIG. 8 with that of FIG. 9, it is seen that the temperature drop across the pellets (and thus the drop in operational efficiency) is substantially increased by the thermal impedance of additional component parts of the prior art device. Specifically, the more thermal impedances there are, the greater the difference between the temperature of the pellets and the temperatures of the components remote from the pellets. The temperature across the pellets, referred to as "pellet dT" on the graphs, is a primary factor in determining system efficiency or thermal response.

For the ensuing description of yet another or fourth embodiment of the invention reference is made simultaneously to FIGS. 10 through 13, a primary advantage of which is the utilization of the modular construction as a fluid impeller means to enhance movement of both conditioned fluid and waste heat fluid. It will be noted in FIG. 10 that each heat transferring means 86 is arcuately formed. Accordingly, when a plurality of the means 86 are interrelated by complementary thermoelectric pellets 88 and 90 to form modules as described earlier herein, the chain of modules extends longitudinally along a curve 92, instead of a straight line as in the first embodiment, for example. The means 86 may alternatively be formed into the curved geometry by either molding or forming of an initially fabricated flat or straight heat transferring means. First and second circular discs 94 and 96 include ,respectively, first and second sets 98 and 100 of spaced apart supports 102. The supports within each set extend along an arc or curve substantially identical to curve 92. Also, the supports are generally opposite one another and dovetail with each other as shown in FIG. 12 when the discs are assembled onto one another. A first conduit 104 directs ambient fluid (e.g., air) onto the upper half of the thermoelectric modules as indicated by arrow 106, and similarly conduit 108 directs ambient fluid onto the lower half of the modules as indicated by arrow 110.

When the discs 94 and 96 are rotated as a unit, the ambient fluid (e.g., air) is caused to move along what is functionally an impeller formed by the curved sets of modules eliminating need for a blower formerly used to aid heat transfer for both temperature conditioned fluid as well as waste heat transfer. More particularly, assuming use is air-to-air, ambient air communication is provided via the first inlet conduit 104 along the upper half of the modules to exit at the disc edges to a first exit conduit 112 that terminates where temperature conditioned air is desired. Also, the second inlet conduit 108 provides communication to the lower half of the modules to exit at the disc edges into second exit conduit for waste heat transference. As already noted, rotation of the discs by, say, motor 116 induces air flow with help of the module arrangement also acting as an air impeller blade. Still further, although not shown, a plurality of lengths of curved modules can be mounted on the discs further increasing air flow therepast.

It is important to note that the supports 102 are individually dimensioned and spaced apart so as to substantially fill the lateral spaces 118 between adjacent means 86 (FIG. 13) whereas a synthetic plastic foam 120 fills the space between the pellets 88 and 90. In this way, ambient fluid moving therealong does not leak through the module wall, but instead is channeled directly to the ultimate location of heat transfer which has the result of increasing operational efficiency. Electrical energization can be provided to the modules from an external source via brush means 122, for example (FIG. 10). Additionally, the gaps 124 and 126 between the conduits 112 and 114 and the respective moving discs 94 and 96 can be effectively closed off by a material known as a ferro-fluidic seal manufactured and sold by Ferrofluidics Inc., New Hampshire.

Figure 14:
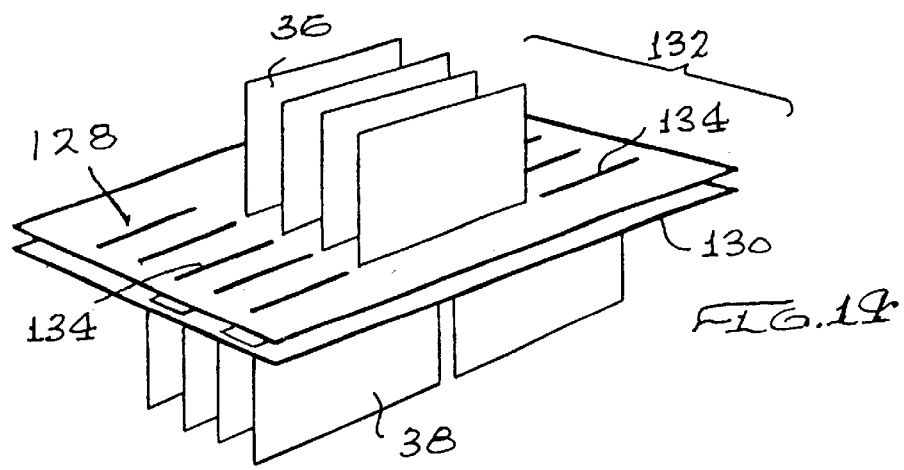
FIG. 14 is a fifth embodiment of the invention shown in perspective and relating to support plates that also act as heat shields for the modules.
Figure 15:
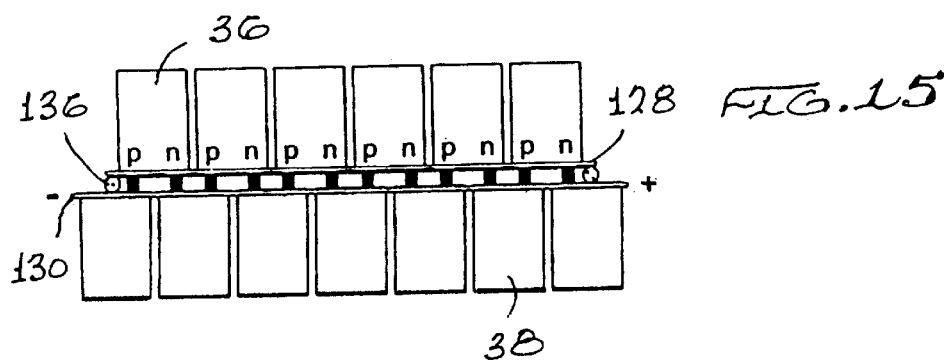
FIGS. 15 and 16 are elevational views of the FIG. 14 embodiment taken at 90-degrees to one another.
Figure 16:
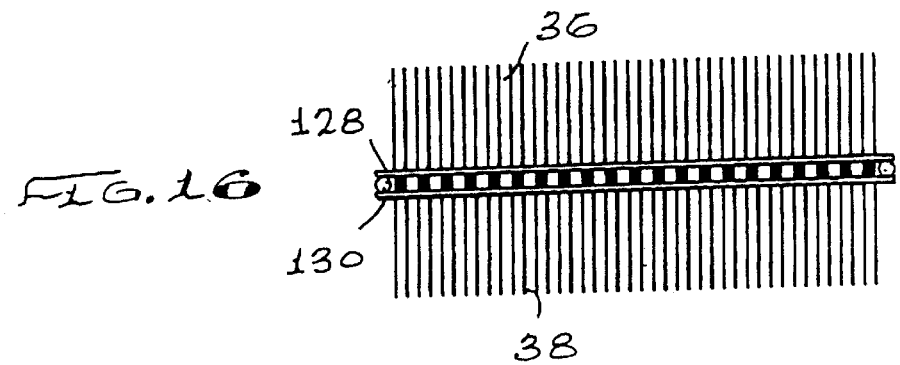

For the ensuing detailed description of a fifth embodiment of the invention reference is now made to FIGS. 14–16. First and second support plates 128 and 130, which may be of identical construction, include sets 132 of parallel slotted openings 134 of such relative spaced apart relation as to receive previously described fin/conductors 36, 38 therethrough with the plates pressed against the module conductors. When so assembled, the plates 128 and 130 provide overall structural rigidity to the modules while, at the same time, establishing an air barrier between the "hot" and "cold" sides of the modules that limits convection into the space between the two plates.

In addition, it is preferable to provide an edge seal 136 such as an O-ring, for example, to reduce even further external convection air currents from moving into the space between the plates and into contact with the semiconductor pellets degrading system heat efficiency. This seal also prevents humid ambient air from making its way to the thermoelectric pellets with resulting deteriorative effect. Still further, the seal 136 imparts additional stability and strength to the overall assembly.

Although other materials made may be found advantageous from which to construct the sheets 128 and 130, best results to date have been obtained with a microwave circuit board laminate made of a polymer and glass fibers or linen fibers with optimal thickness being approximately 0.020 inches. In manufacture, the slotted openings 134 in the a support plate can be formed by use of a water jet or a laser beam. As further alternatives, the plate openings may be formed in a blank plate with a punch. Next, the plates are fitted into the slotted openings and optionally secured in place by a quantity of adhesive. Following this, a fixture may be used to position the thermoelectric pellets onto one side of an assembly enabling securement in place by soldering, for example. The second side of an assembly can be secured in place in the same manner. Finally, the entire assembly can be placed in a furnace or oven to reflow solder and then sealing means are applied to exposed edges.

As a further alternative, the plates 128 and 130 can be constructed by injection molding the plate material directly in place onto the conductor/fins in desired geometrical shape and thickness. In this manner, many of the manufacturing steps of the previously described plate constructions and method of mounting onto the fins are eliminated.

Figure 17:
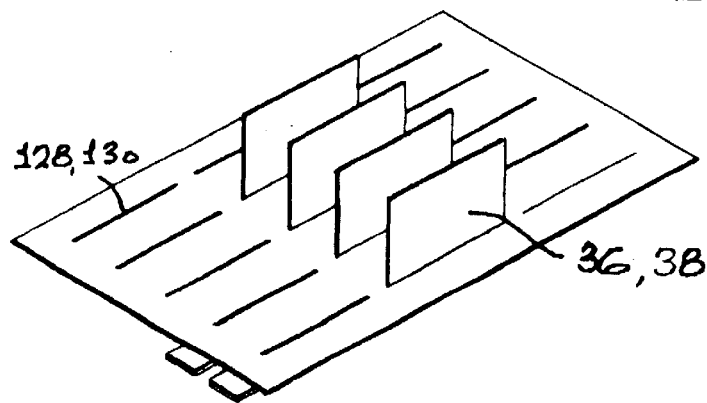
FIG. 17 is a perspective view of a sixth embodiment employing a single support plate.
Figure 18:
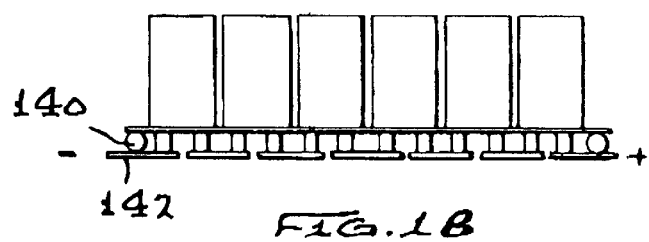
FIG. 18 is an elevational view of the FIG. 17 embodiment.

Yet another or sixth embodiment shown in FIGS. 17–18 includes a single plate 128,130 received onto one side of, say, a fin conductor 36 as in the fifth embodiment of FIGS. 14–16. A sealing means 140 between the plate and connective segment 142 reduces interaction between the "cold" and "hot" sides of the modular stack.

Figure 19:
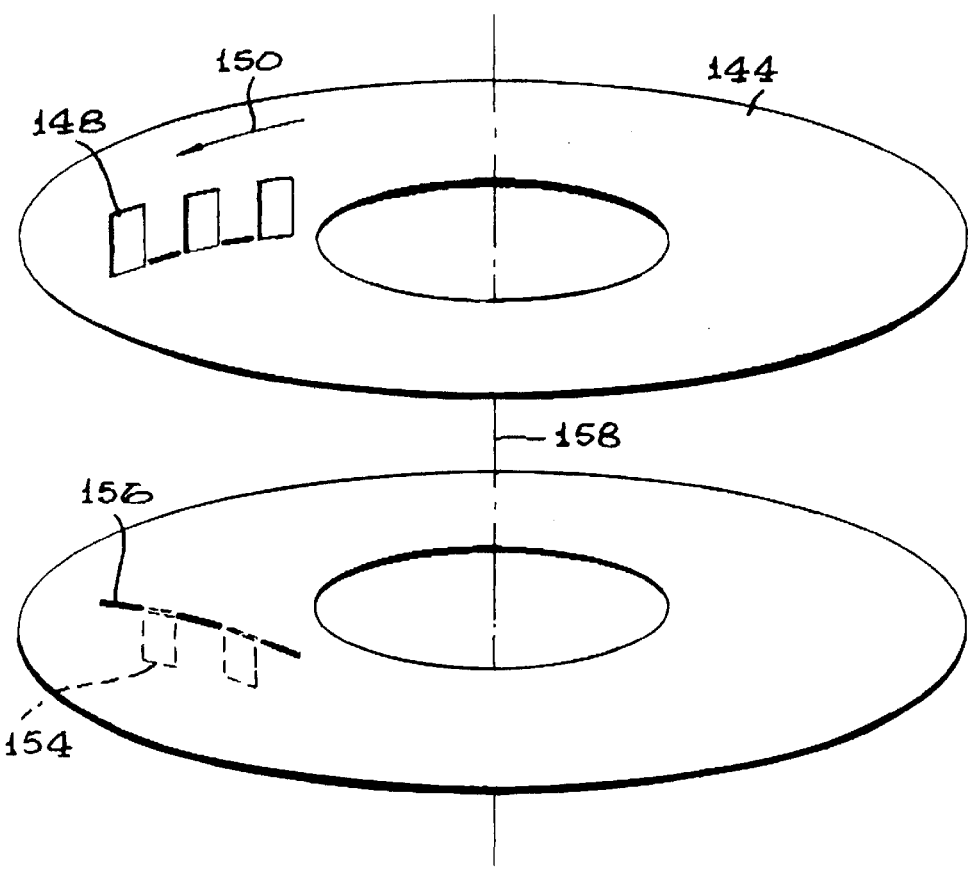
FIG. 19 is a perspective view of a seventh embodiment of the rotating base category.
Figure 20:
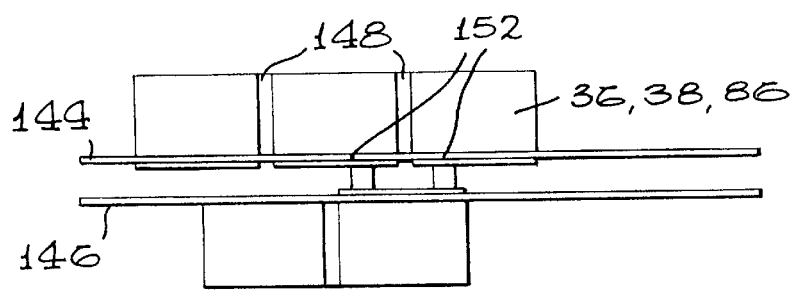
FIG. 20 is an elevational view of FIG. 19.

For a seventh embodiment particularly of the rotating base category, reference is made to FIGS. 19 through 23. As best shown in FIG. 19, two discs 144 and 146 (which can be identical to discs 94 and 96 and motor driven in the same manner) are rotatably mounted in spaced apart relation. A plurality of module spacers 148 are secured to the disc 144 surface facing away from the disc 146 in spaced apart relation and arranged along a curve indicated by arrow 150. Between adjacent module spacers 148 there is provided a slotted opening 152 in the disc 144 of sufficient dimensions to enable receipt of a fin conductor 36 therethrough (FIG. 20). Similarly, a plurality of module spacers 154 (which are preferably constructed identically to spacers 148) are secured to the lower disc 146 on the downwardly facing surface along a curved path identical to 150 and separated by slotted openings 156 identical to openings 152 in disc 144.

Turning now to FIG. 20, a curved line of interconnected modules as shown in FIG. 10, for example, are assembled onto the discs 144 and 146 with the fin conductors 36,38 or heat transferring means 86 respectively extending through an individual slotted opening 152 or 156 and positioned between a pair of spacers 148 or 154, as the case may be. By this arrangement, as the discs and modules mounted thereon are rotated about axis 158 the fin conductors act as impeller blades to enhanced heat transfer and removal of ambient fluid from the disc edges as shown generally in FIGS. 12 and 13. Moreover, in the FIG. 20 configuration the work heat transference fin conductors and waste heat transference fin conductors are separated by the two discs which also enhances system efficiency.

Figure 21:
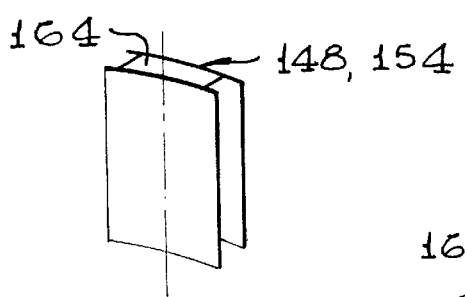
FIG. 21 is an enlarged perspective view of a module spacer used in the FIG. 19 embodiment.
Figure 22:
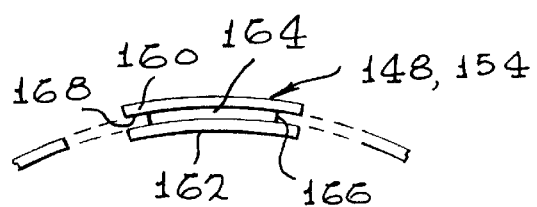
FIG. 22 is a top plan view of a module spacer and heat exchanger fins to arranged therewith in the FIG. 19 embodiment.
Figure 23:
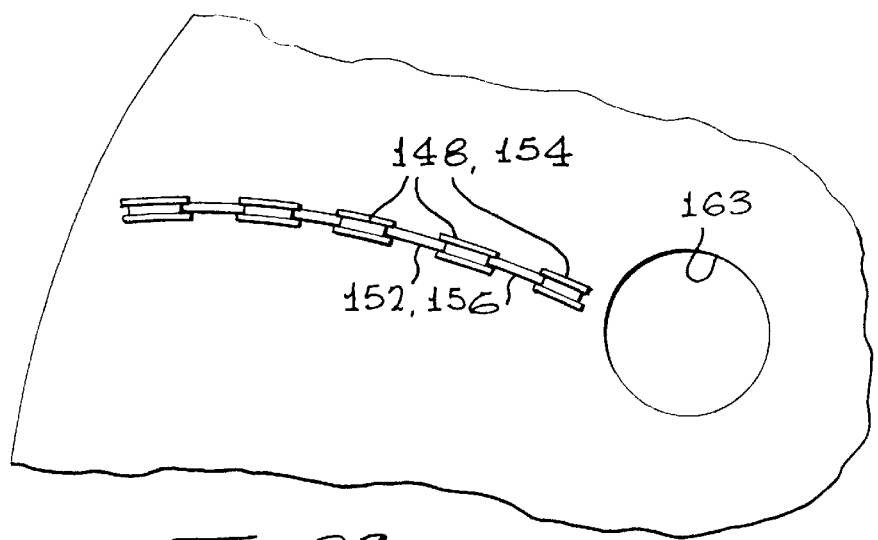
FIG. 23 is an enlarged plan view of a rotating base with module spacers arranged in a curved path in the FIG. 19 embodiment.

For the ensuing details of the construction of spacers 148 and 154, reference is now made to FIGS. 21, 22 and 23. Each spacer includes two outer rectangular plates or panels 160 and 162 of substantially identical dimensions and having a slight curvature about the longitudinal axis 163 of the panels. A central plate or panel 164 is unitarily affixed to the two panels 160 and 162, the dimensions of panel 164 being such as to provide edge slots 166 and 168 which receive edge portions of fin conductors therein on assembly. A space may be constructed by assembly of the three plates or panels together or, alternatively, by extrusion or molding as a single unitary member. Still further, the discs and spacers may be molded as a single composite unit.

In the practice of the present invention there is provided a thermoelectric semiconductor module and assembly or stack thereof which reduces the counteractions of the thermal expansions and contractions which are naturally severe in such apparatus due to the creation of "hot" and "cold" zones during operation. Also, by the reduction of a number of separate parts that have to be assembled together in prior heat pumps and thereby eliminating multi-source heat inertia problems, overall efficiency is increased. Still further, reduction of parts to be assembled the power density is substantially increased and the described modules are simpler, lighter, more compact, efficient and less expensive to manufacture.

Although the application has been described in connection with preferred embodiments, it is to be understood that those skilled in the appertaining arts may contemplate modifications that come within the invention as described and within the ambit of the appended claims. For example, in the spinning disc version, slip-rings, mercury slip joints or rotating contacts may be used to achieve electrical power connection.

What is claimed is:

1. A thermoelectric couple comprising:
    a quantity of p-type thermoelectric semiconductor material;
    a quantity of n-type thermoelectric semiconductor material;
    first, second and third one-piece heat transferring structures constructed of a good electrical and heat conducting material;
    first means for directly contacting and electrically connecting the first heat transferring structure to the quantity of p-type semiconductor material;
    second means for directly contacting and electrically connecting the quantity of p-type material to the second heat transferring structure;
    third means for directly contacting and electrically connecting the quantity of n-type material to the second heat transferring structure;
    fourth means for directly contacting and electrically connecting the quantity of n-type material to the third heat transferring structure; and non-electrically conducting plate means with openings for receiving the respective heat transferring structures therein and positioning said plate means closely adjacent the thermoelectric semiconductor material quantities.

2. A thermoelectric couple as in claim 1, in which a first plate means is received onto the first and third heat transferring structures and a second plate means is received onto the second heat transferring structure, said first and second plate means being separated by a space including the p-type and n-type thermoelectric materials.

3. A thermoelectric couple as in claim 2, in which means are received between outer edge portions of the first and second plate means for sealing the space therebetween against ingress and egress of ambient fluids.

4. A thermoelectric couple as in claim 1, in which the plate means are constructed of a material selected from the list of polymers, glass fibers, and linen.

5. A thermoelectric couple as in claim 1, in which the plate means are constructed of a synthetic plastic material extruded in place about the heat transferring structures.

6. A thermoelectric couple as in claim 1, in which a single plate means is received onto heat transferring structures extending from a first side only of the thermoelectric quantities, and means are provided for sealing the plate mans to heat transferring structures from other sides of the thermoelectric quantities.

7. A thermoelectric couple arrangement, comprising: a plurality of complementary thermoelectric semiconductor pellets serially interconnected with separating heat transferring means arranged in a curved configuration;
    a pair of discs having facing major surfaces spaced apart and aligned;
    a plurality of supports provided on each of the facing surfaces of the discs, the interconnected pellets and heat transferring means being unitarily mounted to the supports; and
    means for rotating discs and mounted pellets and heat transferring means for inducing ambient fluid flow past the pellets and heat transferring means.

8. A thermoelectric couple arrangement as in claim 7, in which adjacent heat transfering means are spaced from one another and on assembly a support fits in between adjacent heat transferring means.

9. A thermoelectric couple arrangement as in claim 8, in which the pellets are arranged in spaced apart relation along the curve; and an insulative foam is located in the spaces between adjacent pellets providing rigidity and preventing ambient air flow between adjacent pellets.

10. A thermoelectric couple arrangement as in claim 7, in which first inlet and outlet conduits are provided for directing ambient air across those parts of the pellets and those heat transferring means conditioning ambient air; and second inlet and outlet conduits for directing ambient air across those parts of the pellets and those heat transferring means handling waste heat.

11. A thermoelectric couple arrangement, comprising:
- a plurality of thermoelectric semiconductor pellets serially interconnected with individual heat transferring means arranged in a generally linear configuration;
- a pair of base means having major surfaces spaced apart and aligned;
- a plurality of spacers mounted in spaced apart relation on oppositely directed major surfaces of the base means in a linear configuration conforming to that of the pellets;
- slotted openings formed in the base means between adjacent apacers dimensioned to receive the heat transferring means therethrough and with the pellets being located between said pair of base means; and
- means for moving the base means, pellets, heat transferring means and spacers with respect to the ambient.

12. A thermoelectric couple arrangement as in claim 11, in which each spacer includes first and second slotted edge walls on opposite edge portions of the spacer for receiving heat transferring means therein.

13. A thermoelectric couple arrangement as in claim 12, in which the spacers are base means are and unitarily molded.

14. A thermoelectric couple arrangement as in claim 11, in which the pellets and heat transferring means are arranged in a curved path.

15. A thermoelectric couple arrangement as in claim 11, in which the base means include first and second discs mounted for rotation about a common axis.

* * * * *

UNITED STATES PATENT AND TRADEMARK OFFICE
CERTIFICATE OF CORRECTION

PATENT NO. : 6,855,880 B2
DATED : February 15, 2005
INVENTOR(S) : Ruszczak et al.

It is certified that error appears in the above-identified patent and that said Letters Patent is hereby corrected as shown below:

<u>Title page,</u>
Item [76], Inventors, add:
-- Rolf Siegel, Wurzburg, Germany
  Michael Stoltz, Munchan, Germany --.

Signed and Sealed this

Fourteenth Day of February, 2006

JON W. DUDAS
*Director of the United States Patent and Trademark Office*